United States Patent
Daimon et al.

(10) Patent No.: US 9,943,010 B2
(45) Date of Patent: Apr. 10, 2018

(54) ELECTRONIC UNIT

(71) Applicant: CALSONIC KANSEI CORPORATION, Saitama (JP)

(72) Inventors: Yuuji Daimon, Saitama (JP); Norio Fujii, Saitama (JP); Hideki Sunaga, Saitama (JP); Haruo Suzuki, Saitama (JP); Yuuzou Shimamura, Saitama (JP)

(73) Assignee: Calsonic Kansei Corporation, Saitama (JP)

( * ) Notice: Subject to any disclaimer, the term of this patent is extended or adjusted under 35 U.S.C. 154(b) by 0 days.

(21) Appl. No.: 15/534,825

(22) PCT Filed: Sep. 4, 2015

(86) PCT No.: PCT/JP2015/075196
§ 371 (c)(1),
(2) Date: Jun. 9, 2017

(87) PCT Pub. No.: WO2016/092919
PCT Pub. Date: Jun. 16, 2016

(65) Prior Publication Data
US 2017/0347491 A1    Nov. 30, 2017

(30) Foreign Application Priority Data
Dec. 9, 2014 (JP) ................ 2014-248663

(51) Int. Cl.
*H05K 7/20* (2006.01)
*H05K 1/02* (2006.01)
(Continued)

(52) U.S. Cl.
CPC ....... *H05K 7/20445* (2013.01); *H05K 1/0203* (2013.01); *H01L 23/02* (2013.01); *H01L 23/28* (2013.01)

(58) Field of Classification Search
CPC ...... H05K 5/0052; H05K 5/0069; H05K 7/20; H05K 7/2039–7/20418;
(Continued)

(56) References Cited

FOREIGN PATENT DOCUMENTS

| JP | H5-27526 U | 4/1993 |
|----|------------|--------|
| JP | H5-50788 U | 7/1993 |

(Continued)

OTHER PUBLICATIONS

International Search Report (English Translation) from PCT/JP2015/075196 dated Nov. 17, 2015 (2 pages).

*Primary Examiner* — Dion R Ferguson
*Assistant Examiner* — Amir Jalali
(74) *Attorney, Agent, or Firm* — Calfee, Halter & Griswold LLP

(57) ABSTRACT

Air in a thermally insulated space, which has been expanded by heat resulting from heating treatment for curing a thermosetting potting material, is prevented from entering the potting material. A casing has a partition wall that partitions an opening into a heat-generating-electronic-component placement section, where a heat generating electronic component is placed, and an adjacent section that is adjacent to the heat-generating-electronic-component placement section, when a heat releasing member is fixed to the opening. The heat-generating-electronic-component placement section is filled with a thermosetting potting material for moisture prevention up to a height which allows at least the heat generating electronic component to be buried in the potting material. The adjacent section has in the casing a communicating portion that communicates with a position which is apart from the heat-generating-electronic-component placement section filled with the potting material.

5 Claims, 3 Drawing Sheets

(51) Int. Cl.
*H01L 23/28* (2006.01)
*H01L 23/02* (2006.01)

(58) Field of Classification Search
CPC ....... H05K 7/20445–7/20463; H05K 7/20518;
H05K 7/20854; H05K 7/205; H05K
7/209; H05K 1/0201–1/0204; H05K
2201/066; H01L 23/02; H01L 23/28
USPC ................ 361/704, 707–709, 714–720, 722;
174/252, 521, 526; 257/713
See application file for complete search history.

(56) References Cited

FOREIGN PATENT DOCUMENTS

| | | |
|---|---|---|
| JP | H5-166954 A | 7/1993 |
| JP | 2004-228159 A | 12/2004 |
| JP | 4043930 B | 2/2008 |
| JP | 2010-147260 A | 7/2010 |
| JP | 2013-165139 A | 8/2013 |

ELECTRONIC UNIT

CROSS-REFERENCE TO RELATED APPLICATION

This application is a U.S. national phase application of International Application No. PCT/JP2015/075196, filed on Sep. 4, 2015, which claims the benefit of priority from Japanese Patent Application No. 2014-248663 filed on Dec. 9, 2014, the entire contents of which are incorporated herein by reference.

TECHNICAL FIELD

The present invention relates to an electronic unit.

BACKGROUND ART

In a vehicle such as an automobile, a large number of electrical components are disposed in respective portions of a vehicle body. To operate and control such electrical components, a large number of electronic units are used.

Such electronic units include one which simultaneously includes a heat generating electronic component that generates heat through energization and a heat-susceptible electronic component (See Patent Literature 1, for example). In the electronic unit having such a configuration, it is required to protect the heat-susceptible electronic component from heat generated from the heat generating electronic component.

Accordingly, in the electronic unit disclosed in Patent Literature 1, a heat generating electronic component and a heat-susceptible electronic component are separately disposed in a casing by interposing a sealed space for thermal insulation between the components, for example. In addition, for the purpose of preventing moisture, each of the heat generating electronic component and the heat-susceptible electronic component is individually sealed with a thermosetting potting material having a heat conductivity higher than that of air.

CITATION LIST

Patent Literature

Patent Literature 1: JP 4043930 B

SUMMARY

Technical Problem

In the above electronic unit, heating treatment is performed to cure the potting material. However, heat generated at this time expands the air in the sealed space for thermal insulation. When the expanded air in the sealed space for thermal insulation enters the potting material, air bubbles are formed in the potting material to develop and burst upon reaching a breaking point, thus causing the formation of a crater or the like.

When the crater is thus formed in the potting material, a moisture preventing effect by the potting material becomes incomplete. As a result, for example, dew condensation water may accumulate in the crater to cause a problem such as: a short circuit due to water exposure in an electronic component, especially a heat generating electronic component or a heat-susceptible electronic component, or in the circuit in which the electronic component is placed; or a circuit breakdown due to the phenomenon of material loss resulting from migration, i.e., ionization.

Therefore, it is a principal object of the present invention to solve the problem described above.

Solution to Problem

To solve the above problem, the present invention provides an electronic unit including a heat releasing member on which a heat generating electronic component is mounted, the heat generating electronic component generating heat through energization, and a casing capable of containing a heat generating electronic component within the casing in a tightly sealed state. The casing has an opening that abuts the heat releasing member. In the opening, the casing has a heat-generating-electronic-component placement section in which the heat generating electronic component is placed, the heat-generating-electronic-component placement section being filled with a thermosetting potting material; a partition wall that partitions the heat-generating-electronic-component placement section within the opening; an adjacent section that is adjacent to the heat-generating-electronic-component placement section via the partition wall; and a lateral wall that covers the adjacent section. An end of the partition wall abuts the heat releasing member. The partition wall, the lateral wall, and the heat releasing member define a space. The lateral wall has a communicating hole that communicates with the inside of the casing that is in the tightly sealed state.

DESCRIPTION OF EMBODIMENTS

The present embodiment will be described below in detail with reference to the drawings. FIGS. 1 to 4 are intended to illustrate the embodiment.

First Embodiment (Configuration) The following will describe a configuration of the embodiment. In a vehicle such as an automobile, a large number of electrical components are disposed in the respective portions of a vehicle body. To operate and control such electronic components, a large number of electronic units are used.

Figure 1:
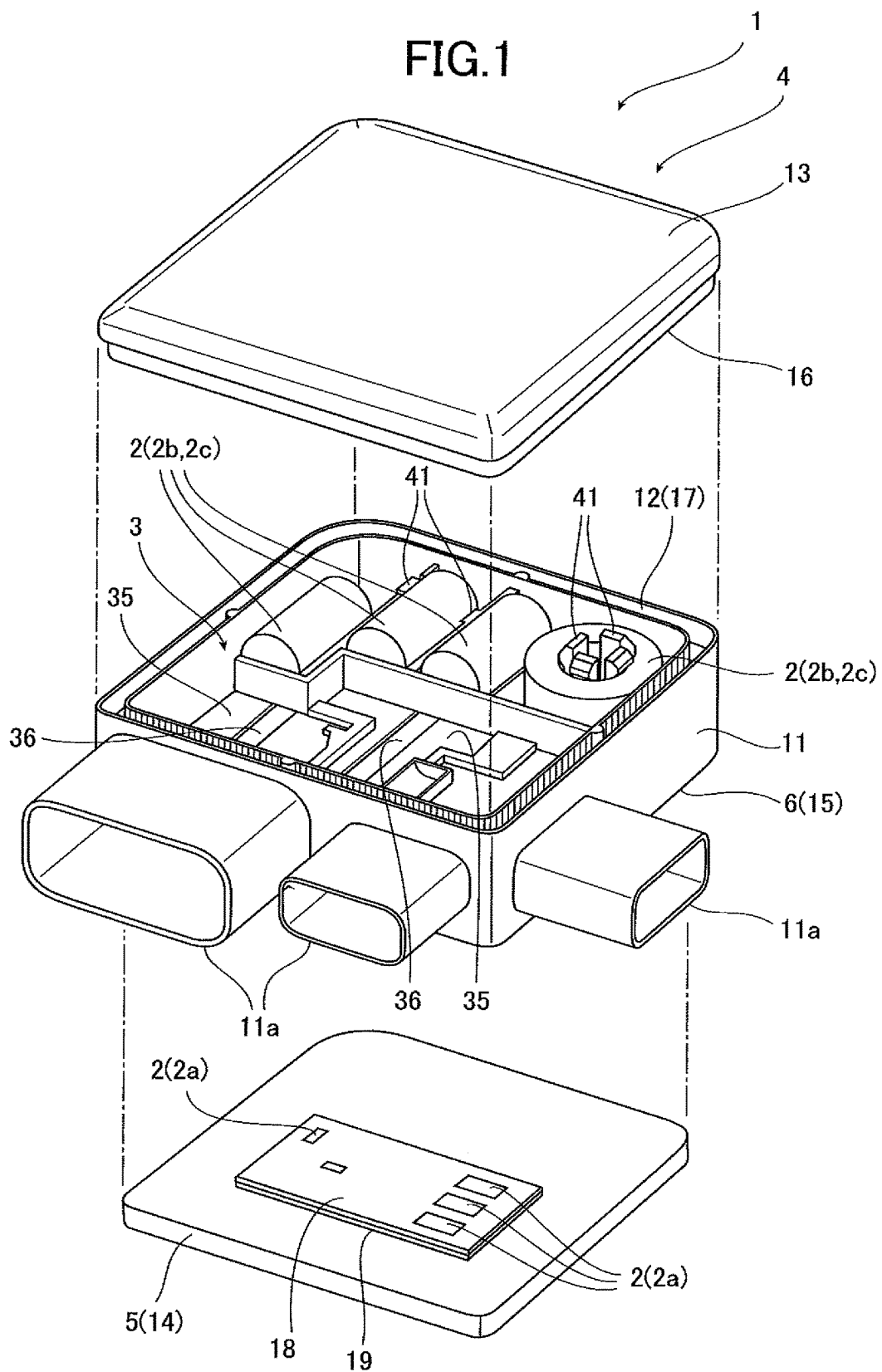
FIG. 1 is an exploded perspective view of an electronic unit according to the present embodiment.
Figure 2:
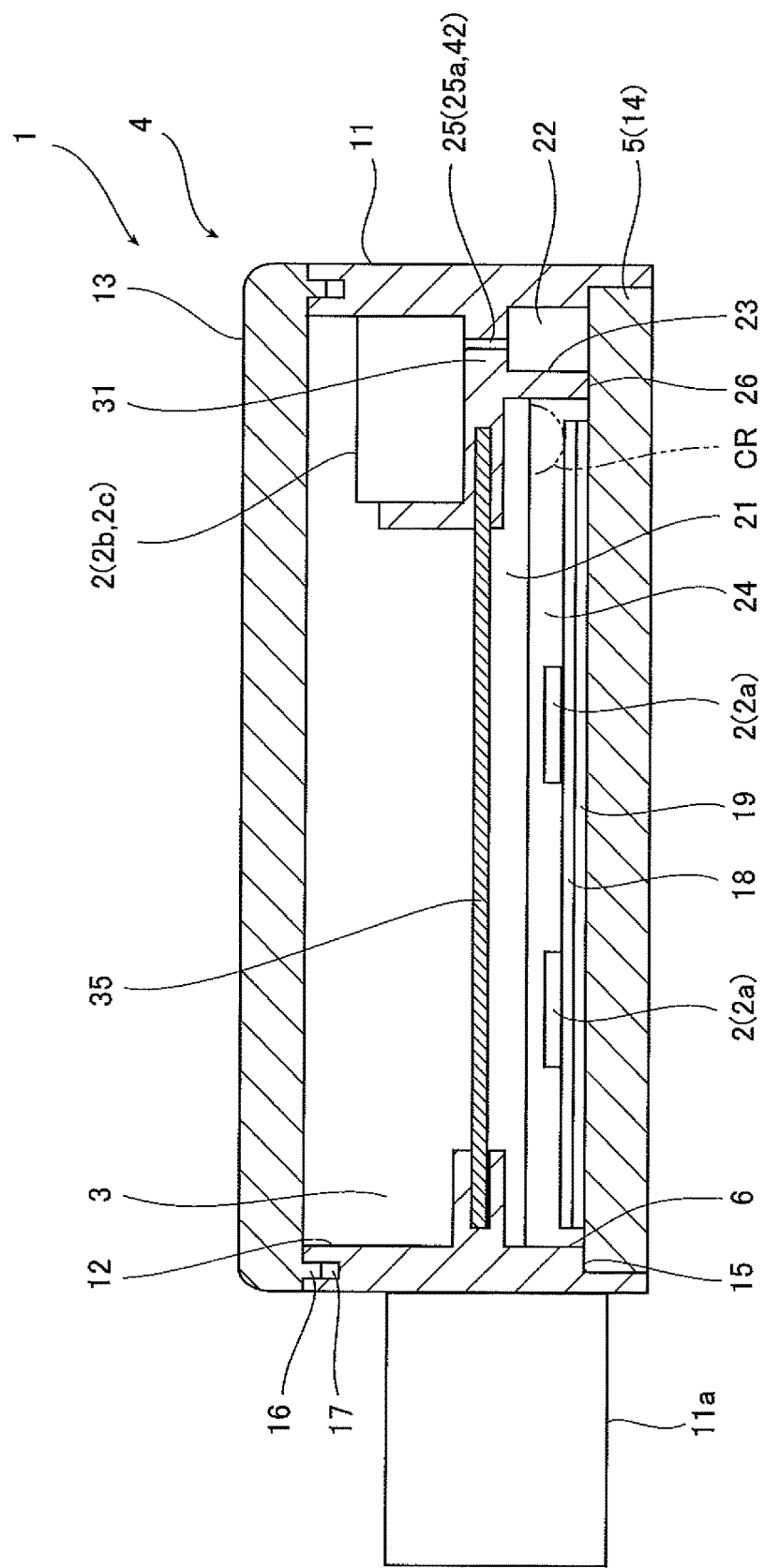
FIG. 2 is a vertical cross-sectional view of the electronic unit of FIG. 1.
Figure 3:
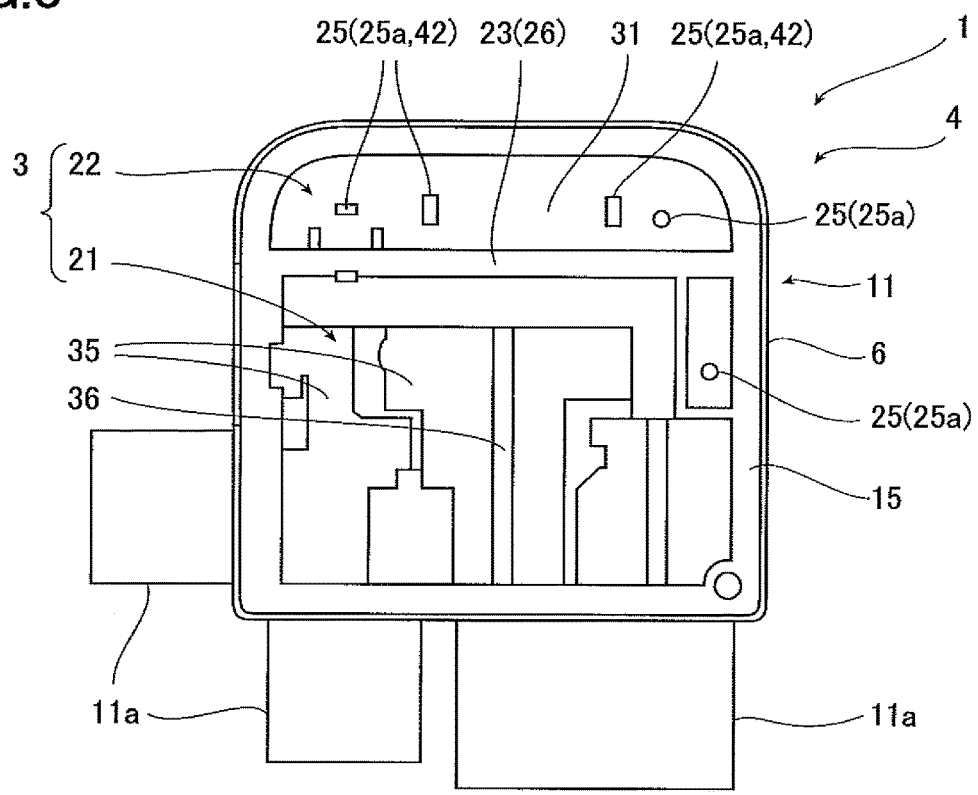
FIG. 3 is a bottom view of the casing of FIG. 1.
Figure 4:
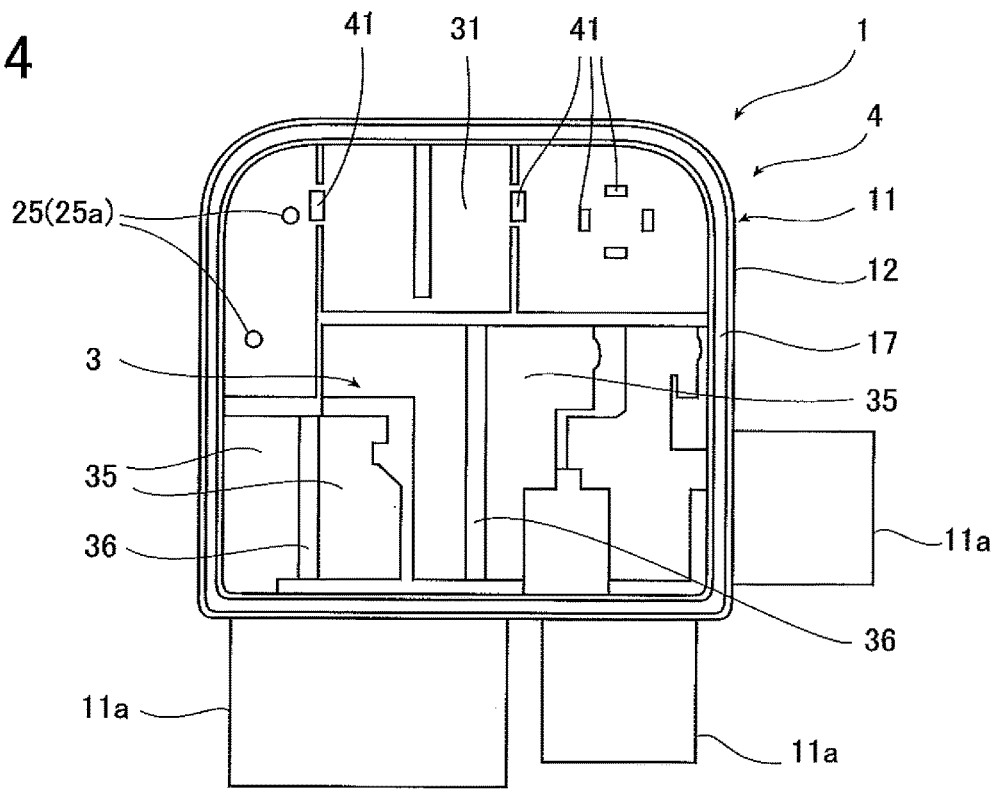
FIG. 4 is a plan view of the casing of FIG. 1.

As shown in FIG. 1, such an electronic unit 1 is configured to include a casing 4 having an electronic component containing space 3 capable of containing electronic components 2 therein, and a heat releasing member 5 on which heat generating electronic components 2a that generate heat through energization are mounted. The casing 4 has an opening 6 to which the heat releasing member 5 can be fixed in an abutting manner.

Here, the electronic unit 1 is provided as a PWM module for performing PWM control such as a controller of a radiator fan. However, the electronic unit 1 is not limited to the above.

The casing 4 has a frame-shaped casing body 11, a lid 13 covering an opening 12 in the top surface of the casing body 11, and a bottom member 14 covering the opening 6 in the back surface of the casing body 11. The casing body 11 is provided with connection holes 11a for connection to external connecters or the like. Each of the lid 13 and the bottom member 14 is adhesively fixed to the respective peripheral edge portions of the openings 6, 12 of the casing body 11 using an adhesive to achieve sealing. Accordingly, the peripheral edge portion of the opening 6 in the back surface of the casing 4 is formed with an adhesion margin 15 corresponding to the peripheral edge portion of the bottom member 14. On the other hand, the peripheral edge portion of the opening 12 in the top surface of the casing 4 is formed with an adhesion groove 17 into which a projecting adhesion rim 16 formed around the peripheral edge portion of the lid 13 is to be fitted and adhesively fixed using an adhesive.

Each of the heat generating electronic components 2a may be a heat generating semiconductor such as a MOS-type FET, a coil, a shunt resistor, or the like, for example. However, the heat generating electronic components 2a are not limited to above. The heat generating electronic components 2a are collectively mounted on a circuit board 18.

The heat releasing member 5 is provided as a heat sink made of metal having a high heat conductivity, such as aluminum, or the like. The circuit board 18 on which the heat generating electronic components 2a are mounted is fixed to the heat releasing member 5 via a heat conductive material 19 such as a heat conductive adhesive or a heat-transfer sheet. In this embodiment, the bottom member 14 of the casing 4 is used as the heat releasing member 5. By thus using the bottom member 14 as the heat releasing member 5, heat generated from the heat generating electronic components 2a can efficiently be dissipated or released to the outside through a large area.

In addition to basic components as described above, in the embodiment, the following components are included. (1) The casing 4 has a partition wall 23 that partitions the opening 6 into a heat-generating-electronic-component placement section 21 where the heat generating electronic components 2a are placed and an adjacent section 22 that is adjacent to the heat-generating-electronic-component placement section 21 when the heat releasing member 5 is fixed to the opening 6. The heat-generating-electronic-component placement section 21 is filled with a thermosetting potting material 24 for moisture prevention up to a height which allows at least the heat generating electronic components 2a to be buried in the potting material 24. On the other hand, the adjacent section 22 has a communicating portion 25 that communicates with a position in the electronic component containing space 3 of the casing 4 which is apart from the heat-generating-electronic-component placement section 21 filled with the potting material 24.

In this embodiment, the heat-generating-electronic-component placement section 21 is provided as a closed region which occupies the major part of the opening 6 in the back surface of the casing body 11. The circuit board 18 described above is mainly mounted on a portion of the heat releasing member 5, the portion corresponding to the heat-generating-electronic-component placement section 21. However, from a structural viewpoint, it is also possible to extend a portion of the circuit board 18 where the heat generating electronic components 2a are not mounted toward the adjacent section 22 or to provide the circuit board 18 with an extension portion.

The adjacent section 22 is provided as a relatively small closed region corresponding to the rest of the opening 6 in the back surface of the casing body 11. In this embodiment, the adjacent section 22 is provided as an elongate section which extends along one of the sides of the casing body 11 and has a generally rectangular shape in plan view. Partition means to divide the opening 6 along a boundary line.

An edge of the partition wall 23 which is positioned in a side of the opening 6 is used as an abutting portion 26 abutting on the surface of the heat releasing member 5, the extension portion of the circuit board 18, or the like, and also used as an adhesion margin to be bonded to the heat releasing member 5, the extension portion of the circuit board 18, and the like. The partition wall 23 is higher than at least the height of the potting material 24 which fills the section 21 and formed as a dam plate for preventing the potting material 24 from entering the adjacent section 22.

As the potting material 24, a resin having a high heat conductivity, such as a silicone-based resin, is used. For an improved productivity, immediately after an adhesive is applied to the opening 6 in the back surface of the casing 4 and the bottom member 14 is bonded to the opening 6, the heat-generating-electronic-component placement section 21 is filled with the potting material 24 before the adhesive dries. Immediately after that, the potting material 24 is subjected to heating treatment performed using a heating furnace at, e.g., 80 degrees Celsius for 20 minutes or the like to be cured.

From a structural viewpoint, the communicating portion 25 may also formed to entirely open a top portion of the adjacent section 22. The communicating portion 25 will be described later.

(2) An electronic-component placement wall portion 31 on which other electronic components 2b different from the heat generating electronic components 2a can be placed is formed atop the adjacent section 22. The communicating portion 25 is a communicating hole 25a formed in the electronic-component placement wall portion 31.

Please note that each of the other electronic components 2b may be any electronic component 2 other than the heat generating electronic components 2a.

The electronic-component placement wall portion 31 is configured as a lateral wall covering at least the top portion of the adjacent section 22. The electronic-component placement wall portion 31 has a surface substantially parallel with each of the lid 13 and the bottom member 14. However, the electronic-component placement wall portion 31 may also have a concave-convex shape in accordance with other electronic components 2b placed on the wall portion 31, or the like. The electronic-component placement wall portion 31 may have a size same as the top portion of the adjacent section 22 described above or may also have a size which extends from the top portion of the adjacent section 22 in accordance with the other electronic components 2b placed on the wall portion 31. In this embodiment, the electronic-component placement wall portion 31 has the latter size. In the inside of the electronic-component placement wall portion 31 or the like, a wiring portion 35 is embedded as required. The circuit board 18 described above and the electronic components 2 are electrically connected to the wiring portion 35. In this embodiment, the electronic components 2 generally include the heat generating electronic components 2a, the other electronic components 2b, and the like. Note that, a portion of the electronic-component placement wall portion 31 which is located above the heat-generating-electronic-component placement section 21 may be provided with through space portions 36 or filling ports for filling the potting material 24 or the like as appropriate. The through space portions 36 are formed in the adjacent section 22, the wiring portion 35, or the like.

The communicating holes 25a are small holes. Any number of the communicating holes 25a, each of which has any shape and any size, may be provided on any places of the electronic-component placement wall portion 31. However, to efficiently dissipate the air in the adjacent section 22 which has been expanded by heat during the heating treatment of the potting material 24, the plurality of communicating holes 25a are preferably located as even as possible relative to the electronic-component placement wall portion 31. By contrast, to enhance the thermally insulating effect in the adjacent section 22, the size and number of the communicating holes 25a are preferably minimized. Accordingly, the communicating holes 25a are set in consideration of the balance between an air dissipation property during the heating treatment of the potting material 24 described above and a thermal insulation property under normal conditions.

(3) The electronic-component placement wall portion 31 is provided with engagement claws 41 that engage with the other electronic components 2b to hold the other electronic components 2b. Each of the communicating holes 25a has a punch-out hole 42 which is formed when the engagement claws 41 are molded.

Each of the engagement claws 41 is configured to extend integrally from the electronic-component placement wall portion 31 toward the other electronic components 2b, for example. The punch-out hole 42 is a hollow portion formed in the base portion of the each engagement claw 41 after a slide die used to mold the engagement claws 41 is retracted. Note that each of the communicating holes 25a may also include a dedicated breathing hole or the like in addition to the punch-out hole 42 for the engagement claws 41.

(4) The other electronic components 2b are heat-susceptible electronic components 2c.

The heat-susceptible electronic components 2c, i.e., heat-sensitive electronic components can be an electrolytic capacitor, a varistor, an oscillator, and the like, for example. However, the heat-susceptible electronic components 2c are not limited thereto.

(Function) The following will describe the function of the embodiment. The casing 4 contains the electronic components 2 within the electronic component containing space 3 and protects the electronic components 2. The casing 4 has the opening 6 and the heat releasing member 5 on which the heat generating electronic components 2a are mounted abuts on the opening 6 and is fixed to the opening 6. Thereby, heat generated from the heat generating electronic components 2a can be released from the entire surface of the heat releasing member 5 to the outside by using the heat releasing member 5.

The electronic unit 1 described above is manufactured as follows. That is, first, in the electronic component containing space 3 of the casing 4, the electronic components 2 such as the other electronic components 2b and the heat-susceptible electronic components 2c are mounted. These electronic components 2 are fixed to the engagement claws 41 or the like and also electrically connected to the wiring portion 35. Next, an adhesive is applied to the opening 6 in the back surface of the casing 4 to bond the bottom member 14 to the opening 6. In this embodiment, the bottom member 14 is particularly configured as the heat releasing member 5 on which the circuit board 18 having the heat generating electronic components 2a is mounted in advance. Then, before the adhesive dries, the heat-generating-electronic-component placement section 21 is filled with the potting material 24 and immediately subjected, together with the casing 4, to the heating treatment using the heating furnace to cure the potting material 24. Finally, an adhesive is applied to the opening 12 in the top surface of the casing 4 and the lid 13 is bonded to the opening 12.

(Effects) According to the embodiment, the following effects can be obtained. (1) The partition wall 23 is provided in the opening 6 of the casing 4. Accordingly, the partition wall 23 can partition the opening 6 into two regions which are the heat-generating-electronic-component placement section 21 and the adjacent section 22 to ensure the adjacent section 22 where the heat generating electronic components 2a are not placed. As a result, it is possible to use the adjacent section 22 where the heat generating electronic components 2a are not placed as a thermally insulated space.

In addition, the heat-generating-electronic-component placement section 21 is filled with the thermosetting potting material 24 for moisture prevention up to a height which allows at least the heat generating electronic components 2a to be buried in the potting material 24. This allows the heat generating electronic components 2a to be encapsulated with the thermosetting potting material 24 and to have moisture resistance. Since the potting material 24 has a heat conductivity higher than that of air, heat generated from the heat generating electronic components 2a through energization can efficiently be transferred to the heat releasing member 5 or the like via the potting material 24. In addition, by limiting the height of the potting material 24 filling the heat-generating-electronic-component placement section 21 to a level in which the potting material 24 bury the heat generating electronic components 2a and by preventing the adjacent section 22 from being filled with the potting material 24, it is possible to minimize the used amount of the potting material 24 and suppress a cost increase and a weight increase because of the potting material 24.

Moreover, the communicating portion 25 is provided in the adjacent section 22 to communicate the adjacent section 22 with a position in the electronic component containing space 3 of the casing 4 which is apart from the heat-generating-electronic-component placement section 21. This can positively dissipate the air in the adjacent section 22 which has been expanded by heat resulting from the heating treatment for curing the potting material 24 and the pressure thereof to another portion within the casing 4 other than the heat-generating-electronic-component placement section 21. As a result, it is possible to prevent such a problem that the air in the adjacent section 22 which has been expanded by heat resulting from the heating treatment enters the heat-generating-electronic-component placement section 21 from the incompletely dried bonded portion between the partition wall 23 and the heat releasing member 5 and enters the potting material 24 to form air bubbles in the potting material 24 and the air bubbles develop and burst upon reaching a breaking point, thus forming a crater CR as shown by the imaginary line in FIG. 2.

Note that, when the crater CR is formed in the potting material 24, the moisture preventing effect due to the potting material 24 becomes incomplete. As a result, for example, dew condensation water may accumulate in the crater CR to cause a failure such as: a short circuit due to water exposure in the heat generating electronic components 2a or in the circuit in which the heat generating electronic components 2a are placed or a circuit breakdown due to the phenomenon of material loss resulting from migration, i.e., ionization.

To prevent this, the air in the adjacent section 22 which has been expanded by heat resulting from the heating treatment is positively dissipated via the communicating portion 25 to another portion within the casing 4 other than the heat-generating-electronic-component placement section 21 filled with the potting material 24. This allows the potting material 24 filling the heat-generating-electronic-component placement section 21 to be held in a normal unaffected state and can prevent the occurrence of a problem as described above.

(2) The electronic-component placement wall portion 31 is formed atop the adjacent section 22. This allows the adjacent section 22 to be closed by the electronic-component placement wall portion 31 and provide a tightly-sealed thermally insulated space and also allows the other electronic components 2b different from the heat generating electronic components 2a to be positively placed at positions atop the adjacent section 22 using the electronic-component placement wall portion 31.

In addition, in the electronic-component placement wall portion 31, the communicating holes 25a are formed as the communicating portion 25. This allows the air in the adjacent section 22 which has been expanded by heat resulting from the heating treatment for curing the potting material 24 and the pressure thereof to be easily and reliably dissipated to the opposite side of the electronic-component placement wall portion 31 via the communicating holes 25a. Moreover, by configuring the communicating portion 25 as the communicating holes 25a, it is possible to minimize the entrance and exit of air into and from the adjacent section 22 and thus enhance a thermal insulation property due to the adjacent section 22.

(3) The electronic-component placement wall portion 31 is formed with the engagement claws 41. This allows the electronic-component placement wall portion 31 to easily engage with the other electronic components 2b to hold the other electronic components 2b by using the engagement claws 41.

In terms of the structure of the die, when the engagement claws 41 are molded, the punch-out hole 42 is formed in the base portion of each engagement claw 41, and the punch-out hole 42 is used at least a portion of each of the communicating holes 25a. By thus providing the engagement claws 41, the communicating holes 25a can simultaneously be obtained, which is efficient with no structural waste.

(4) In particular, the heat-susceptible electronic components 2c are provided as the other electronic components 2b. This allows the heat-susceptible electronic components 2c to be disposed at positions thermally farthest from the heat generating electronic components 2a in the casing 4. In addition, the heat-susceptible electronic components 2c are isolated by the adjacent section 22 from the heat releasing member 5. As a result, even when the heat generating electronic components 2a generate heat through energization, the heat generated from the heat generating electronic components 2a is transferred to the heat releasing member 5, and the heat releasing member 5 releases the heat from the entire surface thereof to the outside, the heat-susceptible electronic components 2c can effectively be protected from the heat. This can eliminate the need to make a specification change from the heat-susceptible electronic components 2c to a costly heat-resistant electronic component such as, e.g., a heat resistant capacitor and can accordingly reduce component cost.

Furthermore, it is possible to place the heat generating electronic components 2a and the heat-susceptible electronic components 2c in the casing 4 with high space efficiency and thus reduce the size of the casing 4.

While the embodiments have been described in detail with reference to the drawings, the embodiments are only illustrative and exemplary of the invention. Accordingly, the invention is not limited to the configurations of the embodiments. It will be appreciated that any design change and the like that do not depart from the gist should be included in the invention. It is to be understood that, when multiple configurations are incorporated in each of the embodiments, for example, possible combinations of these configurations are included in the invention without any particular description. It should further be understood that, when multiple embodiments and modifications are disclosed as those of the invention, any possible combinations of configurations among these embodiments and modifications are considered to be included in the invention without any particular description. Moreover, configurations disclosed in the drawings are naturally considered to be included in the invention without any particular description. Further, the term "and/or the like (such as)" is used to indicate that any equivalent is also included. Also, when such a term as "substantially", "about", or "approximately" is used, this means that a value or the like within a range or accuracy which is reasonably acceptable is also included.

REFERENCE SIGNS LIST

1 Electronic unit
2 Electronic component
2a Heat generating electronic component
2b Another electronic component
2c Heat-susceptible electronic component
3 Electronic component containing space
4 Casing
5 Heat releasing member
6 Opening
21 Heat-generating-electronic-component placement section
22 Adjacent section
23 Partition wall
24 Potting material
25 Communicating portion
25a Communicating hole
31 Electronic-component placement wall portion
41 Engagement claw
42 Punch-out hole

What is claimed is:
1. An electronic unit, comprising:
a heat releasing member on which a heat generating electronic component is mounted, the heat generating electronic component generating heat through energization, and
a casing capable of containing the heat generating electronic component within the casing in a tightly sealed state,
the casing having an opening that abuts the heat releasing member,
in the opening, the casing comprising:
a heat-generating-electronic-component placement section in which the heat generating electronic component is placed, the heat-generating-electronic-component placement section being filled with a thermosetting potting material,
a partition wall that partitions the heat-generating-electronic-component placement section within the opening,
an adjacent section that is adjacent to the heat-generating-electronic-component placement section via the partition wall, and
a lateral wall that covers the adjacent section,
wherein an end of the partition wall abuts the heat releasing member, and the partition wall, the lateral wall, and the heat releasing member define a space, the lateral wall has a communicating hole that communicates with the inside of the casing that is in the tightly sealed state.

2. The electronic unit according to claim 1, wherein the lateral wall that covers the adjacent section is an electronic-component placement wall portion where an electronic component other than the heat generating electronic component can be placed, and the communicating hole is formed in the electronic-component placement wall portion.

3. The electronic unit according to claim 2, wherein the electronic-component placement wall portion is provided with an engagement claw that engages with the electronic component to hold the electronic component and the communicating hole has a punch-out hole which is formed when the engagement claw is molded.

4. The electronic unit according to claim 2, wherein the electronic component is a heat-susceptible electronic component.

5. The electronic unit according to claim 1, wherein the partition wall partitions the opening of the casing along one side of the casing.

* * * * *